US008432165B2

(12) United States Patent
Weiger Senften et al.

(10) Patent No.: US 8,432,165 B2
(45) Date of Patent: Apr. 30, 2013

(54) SIMULTANEOUS EXCITATION AND ACQUISITION IN MAGNETIC RESONANCE

(75) Inventors: Markus Weiger Senften, Zurich (CH); Franciszek Hennel, Karlsruhe (DE)

(73) Assignee: Bruker BioSpin MRI GmbH, Ettlingen (DE)

( * ) Notice: Subject to any disclaimer, the term of this patent is extended or adjusted under 35 U.S.C. 154(b) by 476 days.

(21) Appl. No.: 12/659,239

(22) Filed: Mar. 2, 2010

(65) Prior Publication Data

US 2010/0244827 A1 Sep. 30, 2010

(30) Foreign Application Priority Data

Mar. 25, 2009 (DE) .......................... 10 2009 014 924

(51) Int. Cl.
 *G01V 3/00* (2006.01)
 *A61B 5/05* (2006.01)
(52) U.S. Cl.
 USPC ............ 324/307; 324/309; 324/318; 600/410
(58) Field of Classification Search .......... 324/300–322; 382/128–131; 600/407–435
 See application file for complete search history.

(56) References Cited

U.S. PATENT DOCUMENTS

| | | | | |
|---|---|---|---|---|
| 4,885,542 A * | 12/1989 | Yao et al. | ...................... | 324/313 |
| 7,132,828 B2 * | 11/2006 | Lustig et al. | ................... | 324/309 |
| 7,328,054 B2 * | 2/2008 | Jesmanowicz | ................ | 600/410 |
| 7,403,006 B2 | 7/2008 | Garwood | | |
| 7,425,828 B2 | 9/2008 | Garwood | | |
| 7,570,054 B1 * | 8/2009 | Lin | ................................ | 324/309 |
| 7,684,846 B2 * | 3/2010 | Johnson et al. | ............... | 600/407 |
| 7,841,982 B2 * | 11/2010 | Johnson et al. | ............... | 600/437 |
| 8,143,890 B2 * | 3/2012 | Dong et al. | .................... | 324/309 |
| 2003/0102866 A1 * | 6/2003 | Katscher et al. | .............. | 324/318 |
| 2004/0204643 A1 * | 10/2004 | Jesmanowicz | ................ | 600/410 |
| 2005/0110487 A1 * | 5/2005 | Zhu | ............................... | 324/309 |
| 2005/0110488 A1 * | 5/2005 | Zhu | ............................... | 324/309 |
| 2006/0084859 A1 * | 4/2006 | Johnson et al. | ............... | 600/407 |
| 2006/0214660 A1 * | 9/2006 | Lustig et al. | ................... | 324/309 |
| 2006/0287596 A1 * | 12/2006 | Johnson et al. | ............... | 600/437 |
| 2006/0293597 A1 * | 12/2006 | Johnson et al. | ............... | 600/437 |
| 2007/0188171 A1 | 8/2007 | Garwood | | |
| 2007/0282200 A1 * | 12/2007 | Johnson et al. | ............... | 600/437 |

(Continued)

OTHER PUBLICATIONS

F.J. Rybicki et al., "Analytic reconstruction of magnetic resonance imaging signal obtained from a periodic encoding field", Med. Phys. 27 (2000), Pa. 2060-2064.

(Continued)

*Primary Examiner* — Melissa Koval
*Assistant Examiner* — Tiffany Fetzner
(74) *Attorney, Agent, or Firm* — Paul Vincent

(57) ABSTRACT

A method for magnetic resonance spectroscopy (=MRS) or magnetic resonance imaging (=MRI) in which an NMR time-domain signal is generated by an excited transverse nuclear magnetization precessing about the applied magnetic field, whereby the RF excitation pulse is adapted to cover a whole range of NMR frequencies of interest present in the object, and time-domain signal acquisition takes place during, or during and after the application of the RF excitation pulse, is characterized in that spectral or image data are reconstructed by a matrix product of a reconstruction matrix and a vector of time-domain signal points, the reconstruction matrix being an inversion of an encoding matrix. An improved method for reconstructing spectral or image data from a time-domain signal is thereby provided which is more versatile than conventional Fourier transform.

15 Claims, 6 Drawing Sheets

U.S. PATENT DOCUMENTS

| | | |
|---|---|---|
| 2008/0024128 A1 | 1/2008 | Song |
| 2009/0179643 A1* | 7/2009 | Lin .............................. 324/312 |
| 2010/0085050 A1* | 4/2010 | Dong et al. .................. 324/309 |
| 2010/0244827 A1* | 9/2010 | Hennel ........................ 324/309 |
| 2012/0150458 A1* | 6/2012 | Sodickson et al. ............. 702/57 |

OTHER PUBLICATIONS

L. Vanhamme et al., "MR spectroscopy quantitation: a review of time-domain methods", NMR Biomed. 14 (2001), Pa. 233-246.

D. Idiyatullin et al., "Gapped pulses for frequency-swept MRI", J. Magn. Reson. 193 (2008), Pa. 267-273.

Hafner, S., Fast imaging in liquids and solids with the back-projection low angle shot (BLAST) technique, Magn. Reson Imag 12 (1994) 1047-1051.

Pipe JG., "Spatial encoding and reconstruction in MRI with quadratic phase profiles", Magn. Reson Med. 33 (1995) 24-33.

Idiyatullin D. et al., "Fast and quiet MRI using a swept radifrequency", J. Magn. Reson 181 (2006) 342-349.

Dadok J. et al., "Correlation NMR spectroscopy", J. Magn. Reson 13 (1974) 243-248.

Kuethe D. et al., "Transforming NMR Data despite Missing Points", J. Magn. Reson 139 (1999) 18-25.

Park JY. et al., Improved gradient-echo 3D magnetic resonance imaging using pseudo-echoes created by frequency-swept pulses, Magn. Reson Med. 55 (2006) 848-857.

Pruessmann KP. et al., "Advances in sensitivity encoding with arbitray k-space trajectories", Magn. Reson Med. 46 (2001) 638-651.

\* cited by examiner

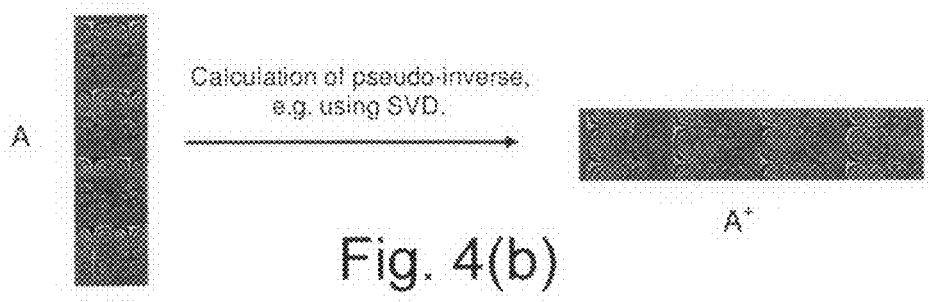
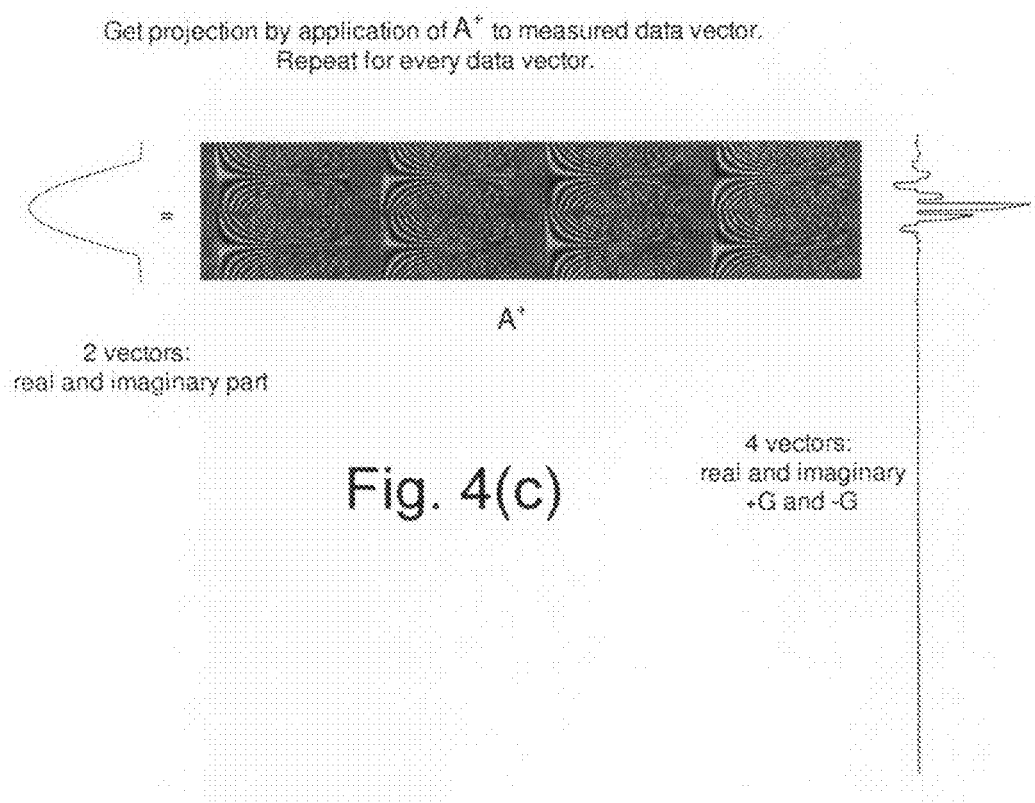

SIMULTANEOUS EXCITATION AND ACQUISITION IN MAGNETIC RESONANCE

This application claims Paris Convention priority of DE 10 2009 014 924.4 filed Mar. 25, 2009 the complete disclosure of which is hereby incorporated by reference.

BACKGROUND OF THE INVENTION

The invention relates to a method for magnetic resonance spectroscopy (=MRS) or magnetic resonance imaging (=MRI) in which an NMR time-domain signal is created by an RF excitation pulse applied to an object in the presence of an applied magnetic field that may depend on spatial position and/or time, said time-domain signal being generated by an excited transverse nuclear magnetisation precessing about the applied magnetic field, whereby the RF excitation pulse is adapted to cover a whole range of NMR frequencies of interest present in the object, and time-domain signal acquisition takes place during, or during and after the application of the RF excitation pulse.

Such a method is known from U.S. Pat. No. 7,403,006 B2.

Magnetic resonance (MR) spectroscopy (MRS) or imaging (MRI) experiments are commonly performed with the pulsed Fourier transform (FT) technique. The spins in a sample are excited with a radio frequency (RF) pulse covering all frequencies required for the isochromats of interest. The term isochromats is used to denote groups of spins having the same resonance frequency. Such an RF pulse is typically amplitude-modulated and has a constant frequency and phase, and its duration is appropriate to provide the required frequency bandwidth. Sometimes, frequency- or phase-modulated pulses are also used. The excitation is followed by the acquisition of the MR signal emitted by the spins. Hence, excitation and acquisition are separated in time. Spectrum or image reconstruction usually includes Fourier transforming the time domain signal or similar procedures such as e.g. back-projection or more general algorithms for the inversion of the encoding procedure. All these types of reconstruction assume that all isochromats have the same phase after the excitation has been completed.

Less common than pulsed FT MR is the continuous wave (CW) technique developed at the beginnings of MR. In CW MR, the excitation is not completed before the data acquisition starts, but the signal bandwidth of interest is scanned with the radio frequency (RF) being swept over this frequency band. The sweep is slow enough to allow the spin system to reach an equilibrium state. The signal emitted by the spins is recorded simultaneously with the excitation. This is usually realized by using separate, decoupled transmitter and receiver coils. Here, the spectral data is obtained directly without the need for a Fourier transform.

In rapid scan correlation spectroscopy (Dadok 1974) the frequency sweep is performed faster than with CW MR and the spin system does not reach an equilibrium state. Assuming linear behaviour, the time domain signal can be considered a convolution of the impulse response of the spin system with the sweep pulse. Hence, the spectrum is obtained by de-convolution followed by Fourier transform or by division of the Fourier transformed signal by the Fourier transformed pulse.

The MRI equivalent of rapid scan correlation spectroscopy is the SWIFT technique (Idiyatullin 2006). A sweep pulse is applied while an imaging gradient is switched on, and the acquisition is performed simultaneously with the excitation. This can be accomplished by using either decoupled transmit and receive circuits or interleaved pulsing and signal reception. Reconstruction of an image profile is performed in analogy to the spectroscopy method. A three-dimensional (3D) image is obtained by application of a series of gradient directions, each providing a different radial projection of the object, followed by a suitable 3D reconstruction algorithm, such as e.g. interpolation onto a Cartesian grid followed by 3D Fourier transform.

The SWIFT method may be regarded as an application of frequency swept excitation pulses that allows the reduction of the peak RF power while keeping the required excitation bandwidth. The simultaneous signal acquisition permits the detection of spins with short transverse relaxation times despite the extended pulse duration.

Sweep pulses are also used in a technique published by Pipe (Pipe 1995), however they are applied before data acquisition. A linearly swept pulse is followed by an RF- or gradient refocusing and then by the data acquisition. This technique uses a quadratic dependence of the transverse magnetisation phase on the resonance frequency offset to time-encode the position of the signal sources and does not require the Fourier transform. Its resolution is lower than that of the Fourier transform-based methods with identical detection times.

The sweep pulses with quadratic phase profiles may also be used for slab selection in classic 3D Fourier-encoded experiments to distribute the signal power to several encoding steps (Park 2006). This has the advantage of reducing the dynamic range of the signal making it less prone to quantisation noise introduced by the analogue-to-digital conversion. The reconstruction of the image uses the discrete 3D Fourier transform.

In certain situations, the reconstruction of the image or spectrum by means of the Fourier transform is not optimal or not possible. These situations include e.g. imaging experiments with undersampled non-Cartesian trajectories using array detection (Pruessmann 2001), or acquisitions with missing samples after the excitation pulse (Hafner 1994, Kuethe 1999).

It is the object of the invention to provide an improved method for reconstructing spectral or image data from time-domain signal obtained with simultaneous excitation and acquisition which can be used more versatilely than conventional Fourier transform.

SUMMARY OF THE INVENTION

This object is achieved, in accordance with the invention, by a method as introduced in the beginning, characterized in that spectral or image data are reconstructed by a matrix product of a reconstruction matrix and a vector of time-domain signal points, the reconstruction matrix being an inversion of an encoding matrix $A_{n\alpha}$ whose elements are calculated using the formula:

$$A_{n\alpha} = \sum_{m=0}^{n-1} P_m e^{i\Phi(n,m,\alpha)}$$

wherein n is the running number of a time-domain signal point, $\alpha$ is the running number of a discrete image or spectral element, $P_m$ is the m-th discrete element of the RF excitation pulse in the time-domain, and $\Phi(n, m, \alpha)$ is the phase accrued by the transverse nuclear magnetisation related to the discrete image or spectral element $\alpha$ in the time between the discrete RF excitation pulse element $P_m$ and the time-domain signal point n under the influence of the applied magnetic field.

The inventive approach proposes to formulate the encoding procedure as a set of linear equations and to solve the set directly or by means of iterative methods. The inventive approach has the advantage of avoiding assumptions about the data symmetry, periodicity or continuity that are implicitly made by the discrete Fourier transform and lead to artefacts in the spectra or images directly reconstructed with Fourier transform, such as e.g. baseline artefacts. In certain variants of the invention, Fourier transform may be still involved after partial, consistent and artefact-free results have been obtained with the described inversion approach.

The RF excitation pulse is divided into chronological parts (or pulse components), and each part for itself excites an NMR signal, that continues to evolve under the influence of the applied magnetic field. The overall NMR signal is pieced together by superposition. This forward description of the signal generation is subject to the inversion of encoding, in accordance with the invention.

The invention thus allows an improved encoding and improved reconstruction. In particular, the inventive approach does not require gradients constant in time, since no conventional Fourier transform is involved, but a direct inversion of encoding is applied.

In a preferred variant of the inventive method, the applied magnetic field is static and homogeneous and a spectrum is reconstructed that shows the distribution of NMR frequencies inherent to the object. This variant is particularly simple, does not require special hardware to produce field gradients and allows obtaining useful information about the chemical composition of the sample, in particular of a sample with very short transverse relaxation times.

Further preferred is a variant in which the applied magnetic field consists of a static homogeneous component and a time-dependent gradient component, and in which images of the object or a part thereof are reconstructed. This variant allows reducing the reconstruction to a series of reconstruction steps with reduced dimensionality, each proving a projection of the object, and is therefore less computationally demanding and requires less computer memory.

Even further preferred is a variant in which the magnetic field consists of a static homogeneous component and a gradient component that is static during the RF pulse and during the acquisition, and in which images, in particular one-dimensional images, of the object are reconstructed. This variant allows a further computational simplification compared to the previous one, and reduces the acoustic noise produced by switching of the gradient fields.

In an advantageous variant of the inventive method, the amplitude of the RF excitation pulse is zero for certain time intervals, and the acquisition of time domain signal points takes place during these time intervals. This variant of interleaved excitation and acquisition allows essentially simultaneous RF transmission and reception without decoupling of the transmission and reception circuits and thus provides a simplification of the required RF hardware.

A preferred variant of the inventive method provides that the frequency of the RF excitation pulse depends on time in a continuous, non-continuous, or random manner. This variant allows adapting the RF pulse to achieve an optimal excitation of the entire object.

Further preferred is a variant in which simultaneous RF transmission and reception is realised with decoupled transmit and receive circuits. This variant allows the acquisition of the signal without breaks thus avoiding fast hardware switching and maximizing the signal-to-noise ratio.

In another variant, acquisition oversampling is performed wherein the time-domain signal sampling rate is higher than required by the frequency range covered by the object or spectrum to be reconstructed, and whereby the oversampling is sufficiently high to account for effects of transmit—receive switching, to provide an implicit extrapolation of missing time-domain signal points, to provide an accurate representation of the effects created by the used RF pulse, and to thereby enable the creation and inversion of the encoding matrix. This variant enables an improved control over processes influencing the acquired data samples, such as group delays of analogue and digital filters, transmit-receive switching, and blanking periods during pulse application. Furthermore, it reduces baseline artefacts due to missing initial signal in the case of interleaved excitation and acquisition. Finally, the conditioning of the encoding matrix can be improved, leading to a reduced sensitivity of the reconstruction to noise.

A preferred variant is characterized in that a known or estimated value of the transverse relaxation constant $T2^*$ is taken into account as exponential filtering in the encoding matrix in order to improve the resolution or the signal-to-noise ratio of the reconstructed image or spectrum. In this variant, the $T2^*$ relaxation effects are taken into account when the encoding matrix is constructed by applying exponential filtering which leads to an improved resolution or an improved signal-to-noise ratio.

Preferred is also a variant in which additional filtering is directly taken into account by the reconstruction. In this variant, additional filtering operations are included in the encoding matrix leading to an improved signal-to-noise ratio and/or reduced ringing artefacts.

Further, in an advantageous variant, complex or real image or spectrum data are reconstructed, wherein creating a real-valued result is achieved by appropriate zero order phase correction directly applied to the raw data or incorporated into the encoding matrix. Reconstruction of a complex result enables resolving a possible phase but requires more data. Reconstruction of a real result requires less data but makes assumptions about the result.

A preferred variant of the inventive method provides that sensitivities of one or multiple receiver coils are taken into account by the reconstruction in order to perform one or multiple of the following tasks:

a correction for the spatially changing intensity of the receiver coil(s), a correction for the spatially changing phase of the receiver coil(s), using the spatially changing intensity and phase of the receiver coil(s) as an additional source of spatial encoding. This variant allows avoiding image intensity variations due to space-dependent receive-coil sensitivities by taking these sensitivities into account in the construction of the encoding matrix. Further, since the coil sensitivity profiles can be considered as an additional source of spatial encoding, this variant allows a reduction of the amount of data necessary for the reconstruction, thus leading to a reduction of the measurement time. In particular, for gapped acquisition due to interleaved excitation and acquisition, an improved reconstruction can be obtained.

In another preferred variant, the encoding matrix inversion is performed by means of iterative procedures. This variant is computationally more efficient in the case of large image matrices, in particular when the reconstruction cannot be reduced to a series of one-dimensional steps.

Further preferred is a variant in which several measurements take place with the same static and homogeneous component of the applied magnetic field and different additional components of the applied magnetic field, each experiment leading to a partial reconstruction of a sub-space of the object, and the full reconstruction is made by the combination of these partial reconstructions. This variant allows to limit the reconstruction to a sub-space of the imaged space, thus reducing considerably the reconstruction complexity.

Preferably, in a further development of this variant, the partial reconstructions represent one-dimensional projections of the object in different directions, and the full reconstruction is made by back-projection or by one-dimensional Fourier transform of the projections followed by an interpolation to a three-dimensional grid and a three-dimensional inverse Fourier transform. This variant is particularly advantageous from the point of view of the reconstruction complexity as the sub-spaces are one-dimensional.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

A method of magnetic resonance is provided. More specifically, a method of magnetic resonance wherein spin excitation is applied over an extended period, data acquisition is performed during or during and after the excitation, and reconstruction of the spectrum or image is obtained by inversion of the forward description of the encoding procedure.
Spin Excitation Over an Extended Period According to the invention, a MR method is provided wherein spin excitation is applied over an extended period. The duration of the RF excitation pulse $t_p$ is considered with respect to the dwell time dw of the MR experiment which is the inverse of the nominal frequency bandwidth bw, i.e. dw=1/bw. The nominal bandwidth is the frequency range of interest spanned either by the resonances of a sample in MRS or by a spatially dependent field, very often a field gradient, in MRI. Hence, an extended excitation pulse is defined as an RF pulse whose duration is larger than the inverse of this nominal bandwidth, i.e. $t_p \geq$ dw.

Figure 1:
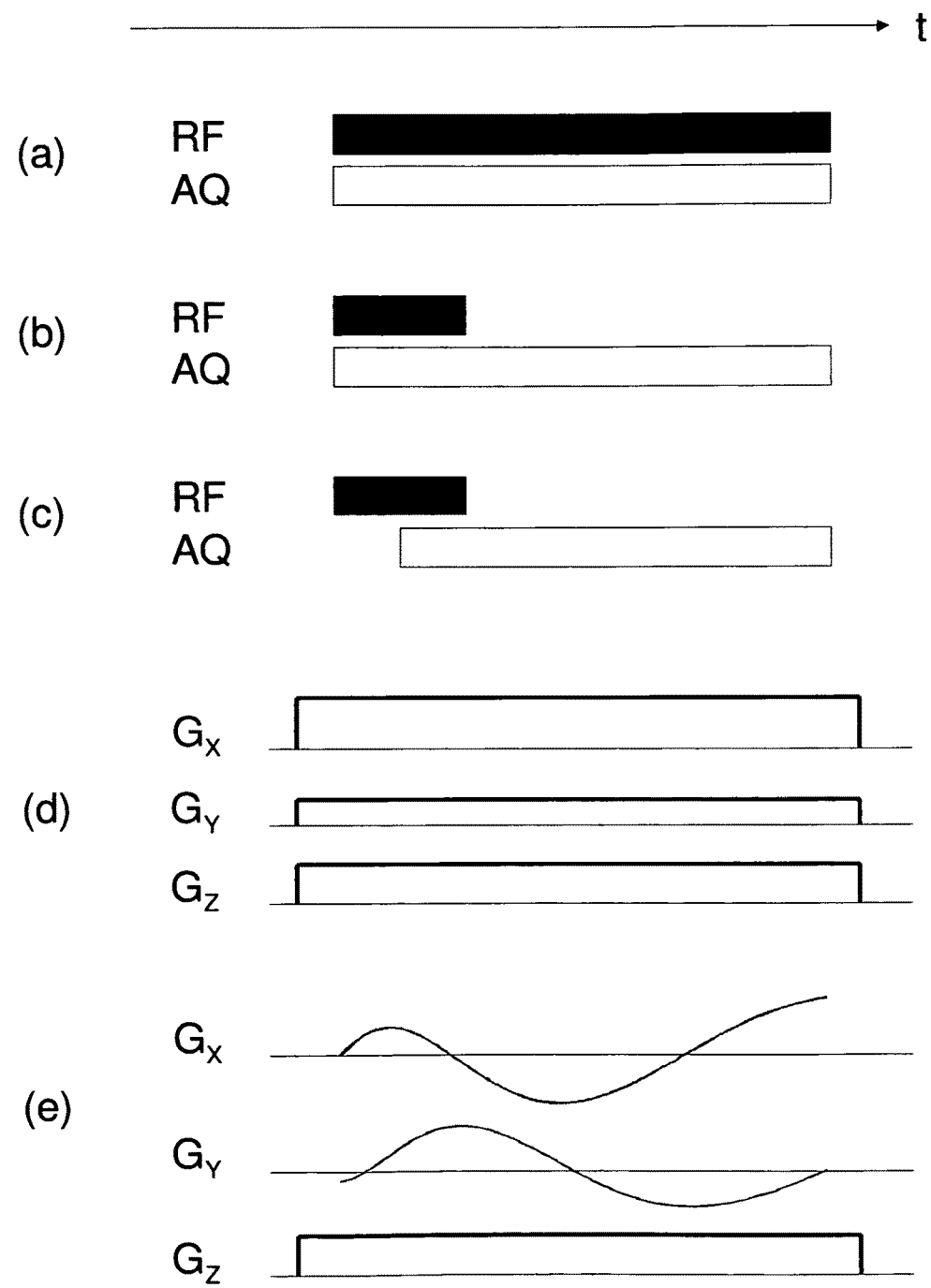
FIG. 1 illustrates different possible timing schemes of extended excitation with acquisition, and possible gradient shapes in case of application in MRI, in accordance with the invention.

The RF pulse itself has an amplitude and frequency, both being variable in time. Alternatively to changing the frequency, also the pulse phase can be modified, with the same effect on the spin system. The pulse may have breaks, meaning that the amplitude is zero at certain time points. The time-variant field created by the RF pulse is described as $B_1(t)$.
Signal Acquisition As shown in FIG. 1, the acquisition (compare "AQ") of the time-domain signal emitted from the excited spins in the sample is performed (a) during, (b) during and after, or (c) partly during and after the RF pulse (compare "RF"). Arrow t indicates the time. Simultaneous acquisition is accomplished either with decoupled receiver systems or quasi-simultaneously by interleaving excitation and acquisition periods.

Acquisition is performed with a suitable oversampling factor OV, resulting in a reduced dwell time $dw_{ov}$=dw/ov and increased bandwidth $bw_{ov}$=bw*ov. Oversampling plays a role in three different tasks. First, in the case of interleaved pulsing and acquisition during the pulse, where signal samples are missing while the pulse is played out, the reconstruction with oversampled data enables, to a certain degree, an implicit replacement of the missing initial signal already present during the pulse. Second, the oversampling enables resolving signal changes due to switching between RF signal transmission and reception, arising from receiver blanking, pre-amplifier switching, and group delays from analogue and digital lifters. Without oversampling such changes are summed up in a single signal value, which then does not only represent the signal emitted from the spins, but also the effects listed above. Third, oversampling enables reconstruction of data from MR experiments performed with extended pulses as will be described below. The minimum required oversampling factor is chosen to satisfy all three tasks.

As also shown in FIG. 1, for MRI with extended excitation, an additional spatially variant magnetic field $B_0(r, t)$ is applied during, after, or during and after the RF pulse. $B_0(r, t)$ is the component of the additional field along the main magnetic field at location r and time t. In one embodiment, these fields are gradient fields (compare $G_x, G_y, G_z$). In one embodiment, the fields are constant over time during RF pulse and acquisition, see FIG. 1 part (d), which will create data to reconstruct a projection of the imaged object along a straight line. In another embodiment, the fields are time-variant, see FIG. 1 part (e), which will create data providing information about the object in two or three dimensions. In order to obtain more information about the sample to be investigated, the experiments shown in FIG. 1 are repeated multiple times with modifications to the amplitudes or shapes, or amplitudes and shapes of the applied fields.

Using the above description for MR experiments with an extended pulse, various embodiments are possible. In one embodiment, MRS is performed with an extended amplitude- and frequency modulated pulse and data acquisition is performed during or during and after the pulse. In another embodiment, MRI is performed with a permanently applied gradient, an extended amplitude- and phase-modulated pulse, and data acquisition is performed during or during and after the pulse.
Spectrum or Image Reconstruction Reconstructing a spectrum or image profile from the acquired time-domain data requires removal of the mixing of signal excited at different times during the pulse. This reconstruction problem is solved by application of the principle of inversion of the forward description of the encoding procedure to the specific problem of MR with extended pulses.

Figure 2:
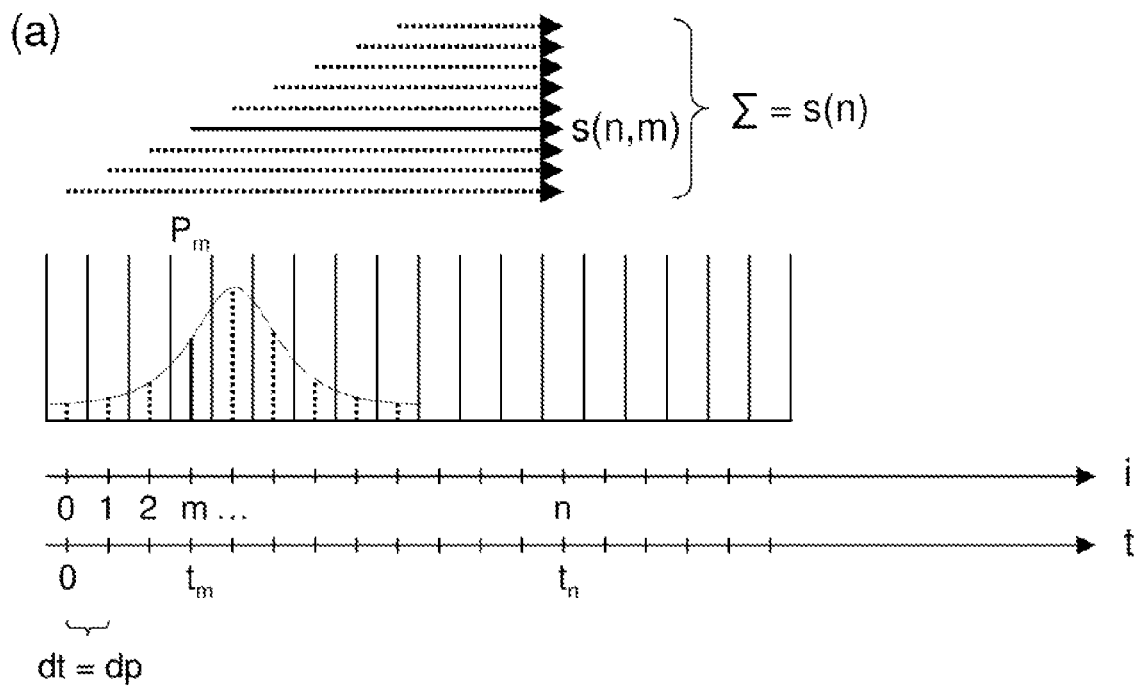
FIG. 2 illustrates the discrete description of the signal evolution with extended excitation, in accordance with the invention.
Figure 2:
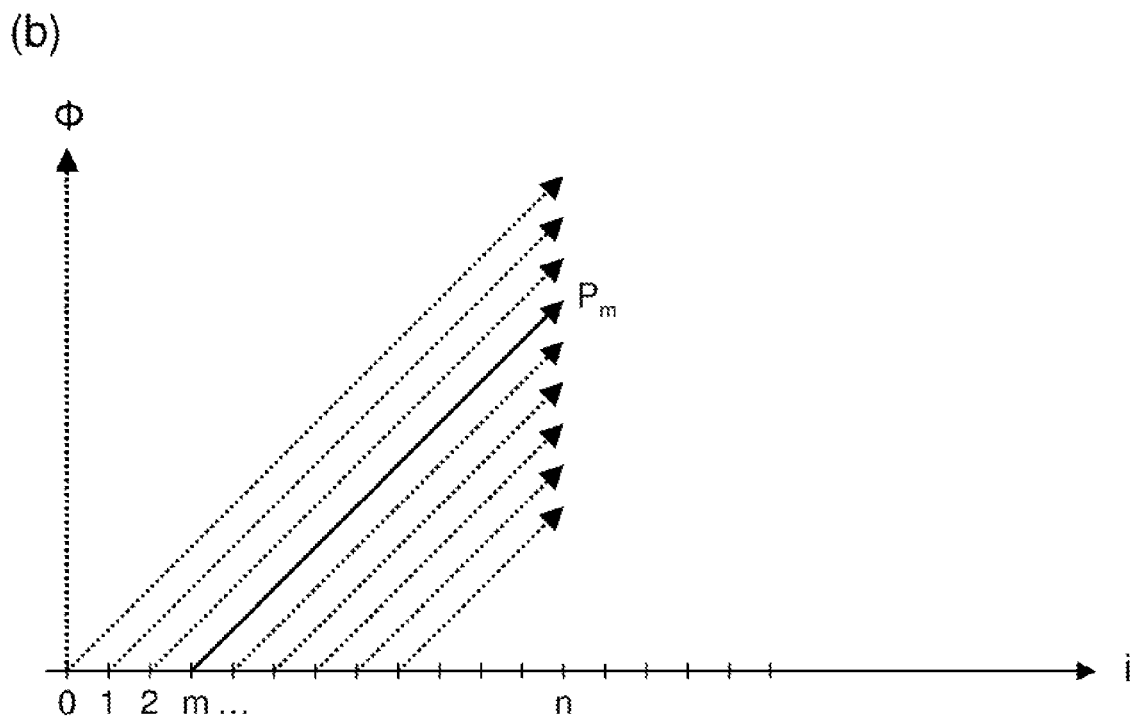

To this end, a discrete description of the signal evolution is used with equidistant time points $t_i$=i·dt where dt is the interval between the time points, and i has integer values equal to or greater than 0. This is illustrated in FIG. 2, part (a). In principle, the discrete description of the signal can also be made on a non-equidistant grid.

An extended pulse $B_1(t)$ is then considered as a series of delta-like sub-pulses, where a delta pulse means an infinitesimally short pulse, and the individual amplitude and phase of the m-th sub-pulse $P_m$ represents the respective interval of size dp which is the spacing of two sub-pulses. Possible suitable choices are $P_m=B_1(t_m)$ or $P_m=\text{average}\{B_1(t)\}$ with $t=[t_m-dp/2, t_m+dp/2]$. The interval dp is chosen short enough to enable full excitation of the nominal bandwidth with a pulse of this duration. Thus, the maximum allowed dp is used as an upper limit for choosing dt of the temporal discretisation. Furthermore, it is used as an upper limit for the over-sampled dwell time $dw_{ov}$ and hence determines the minimum allowed oversampling factor set for the acquisition, as described above. Generally, the discrete formulation of the encoding procedure is simplified by a common time grid of RF pulse description and acquisition sampling.

The spin system is considered linear in the sense that successive RF excitations do not interfere, i.e. the total signal is a superposition of the signals created by successive RF excitations. This assumption is usually sufficiently satisfied as long as the net flip angle of the total extended excitation is below 90 deg.

Also the representation of the sample is described on a discrete grid. In the MRI case, locations $r_\alpha$ in N-dimensional space, with N=1, 2, or 3, are identified with the index $\alpha$.

The signal created by sub-pulse m at time $t_m$ and emitted at time from a discrete location $r_\alpha$ with spin density $\rho_\alpha=\rho(r_\alpha)$ under the influence of the additional field is $$s(n,m,\alpha)=P_m\rho_\alpha e^{i\Phi(n,m,\alpha)} \quad (1)$$

where a further proportionality constant is neglected, and $$\Phi(n, m, \alpha) = \gamma \int_{t_m}^{t_n} B_0(r_\alpha, \tau) d\tau \quad (2)$$

is the phase accrued at location a between time points m and n, with the constant $\gamma$ being the gyromagnetic ratio of the observed nucleus. The proportionality of the signal to $P_m$ assumes very small flip angles created by the sub-pulses; otherwise the sine-dependency of the magnetisation has to be taken into account. The signal from this pulse emitted from all locations is the sum over the locations $$s(n, m) = P_m \sum_\alpha \rho_\alpha e^{i\Phi(n,m,\alpha)}. \quad (3)$$

Finally, the total signal at time point n is the superposed signal of successive pulses, i.e. the sum of the signals created by all pulses played out before the time point $$s(n) = \sum_{m=0}^{n-1} P_m \sum_\alpha \rho_\alpha e^{i\Phi(n,m,\alpha)}. \quad (4)$$

Using a matrix formulation gives $$s_n = \sum_\alpha A_{n\alpha}\rho_\alpha, \quad (5)$$

or $$s=A\rho \quad (6)$$

with $$A_{n\alpha} = \sum_{m=0}^{n-1} P_m e^{i\Phi(n,m,\alpha)} \quad (7)$$

where the signal and spin density values are assembled in the column vectors s and $\rho$, respectively, and A is the encoding matrix of the MR experiment.

Reconstruction of $\rho$ from the measured signal s then requires calculation of the matrix inverse of A and applying it to the vector s $$\rho=A^{-1}s. \quad (8)$$

If A is not quadratic and s has more elements than $\rho$, the inversion is an over-determined minimisation problem that can be solved by calculation of the pseudo-inverse or the singular-value-decomposition (SVD) of A.

In s all measured signal values are assembled. It is not required that signal values are available at all time points on the chosen grid. In particular, there may be missing points due to interleaved RF transmission and reception.

In p all locations are listed that are expected to have non-zero spin density. Usually a continuous but limited spatial range is used which is called the field-of-view (FOV). Together with the additional fields used for spatial encoding, the FOV determines the bandwidth of the emitted signal. The chosen distance of the grid points reflects the spatial resolution asked for from the MR experiment. In principle, only locations and differences between locations can be reconstructed that have been properly encoded by the applied additional fields. Otherwise, the inversion is not well determined. This situation can be overcome to a certain degree by using regularisation, such as e.g. Tikhonov or truncated SVD regularisation.

Generally, all above mentioned vectors and matrices are complex-valued. However, in principle in MR the spin density is real. If other effects adding a phase to the MR signal can be neglected, the vector $\rho$ can be assumed being real-valued. This information improves the reconstruction and can be added by separation of real and imaginary parts in the equations (1)-(8). Then only real values are listed in $\rho$, leading to only half the number of unknown parameters.

A special case of the above description is when the additional fields are constant in time. Then Eqn. (2) becomes $$\Phi(n,m,\alpha)=\gamma(n-m)dtB_0(r_\alpha)=\Phi(n-m,\alpha) \quad (9)$$

and the accrued phase depends only on the time between signal creation and readout, and not on the absolute times. This situation is illustrated in FIG. 2 part (b) where each arrow represents the phase accrued by the signal created by a sub-pulse. The arrows are straight lines because the phase is proportional to the time after signal creation.

Another special case is when the additional fields are gradients in space of strength G(t). This case is described here only for one spatial dimension with strength G(t) but can be extended to more dimensions straightforwardly. For a spatial sampling interval dx the locations are given as $x_\alpha=\alpha\, dx$. Then Eqn. (2) becomes $$\Phi(n, m, \alpha) = \gamma\alpha dx \int_{t_m}^{t_n} G(\tau) d\tau \quad (10)$$

and the integral in Eqn. (10) does not depend on the location and must be calculated only once per time distance.

In a further special case the additional fields are both constant in time and gradients in space. Then Eqn. (2) becomes $$\Phi(n-m,\alpha)=\gamma\alpha dx G(n-m)dt. \qquad (11)$$

The MRS case is treated in analogy to the MRI description with $\omega_\alpha$ being the spectral density at time-invariant frequency $\omega_\alpha = \alpha\, d\omega$, resulting in the accrued phase $$\Phi(n-m,\alpha)=\alpha d\omega(n-m)dt. \qquad (12)$$

If, in the MRI case, multiple experiments are performed with different additional fields, they can be put together in the same reconstruction. However, this may create large matrices which are consuming to process in terms of computer memory requirements and computation time. Alternatively, a single experiment or a subset of experiments can be reconstructed separately and then the results are put together. However, this requires that the data used for a separate reconstruction is sufficient to fully reconstruct the concerned sub-space. An example for this procedure is a series of experiments that use gradient fields that are constant in time. Each single experiment is reconstructed to provide a 1D projection of the object, and different gradient orientations provide differently oriented projections. The series of reconstructed projections is put together by inverse 1D Fourier transform, interpolation onto a 3D Cartesian grid, and 3D Fourier transform.

Figure 3:
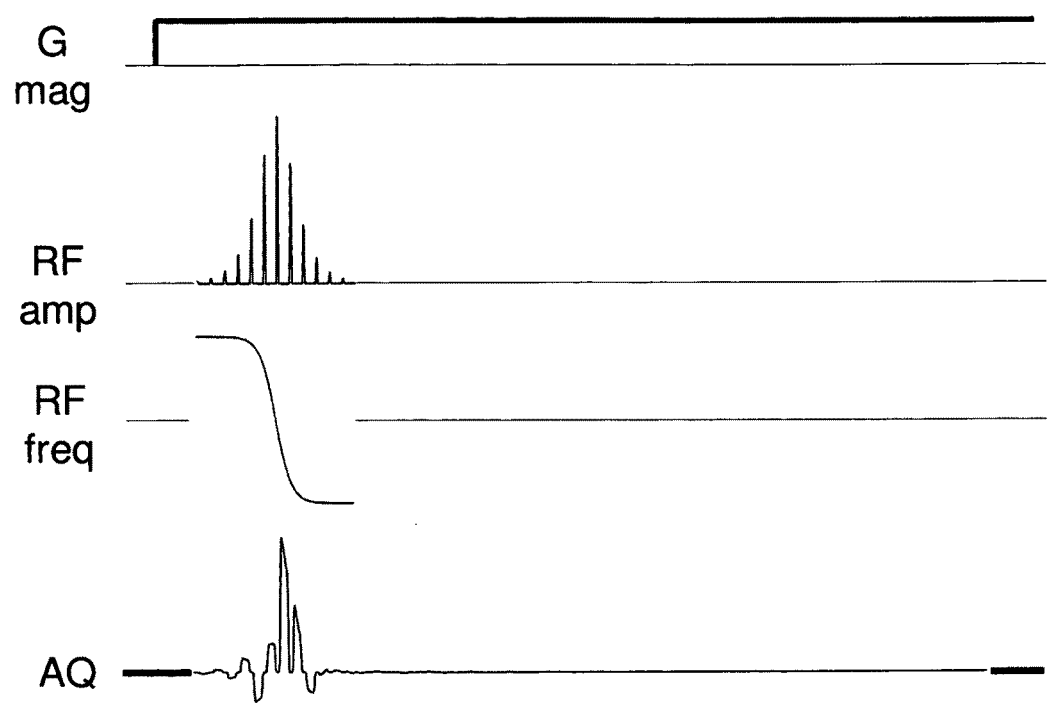
FIG. 3 illustrates the data acquisition for a selected example, in accordance with the invention.

An example of a possible implementation of the invention is illustrated in FIG. 3 and FIGS. 4(a) to (f). FIG. 3 illustrates the acquisition of complex time-domain data used to reconstruct a projection in a certain direction of the object under investigation. An acquisition scheme is used combined from FIG. 1 part (b) and FIG. 1 part (d). Initially, a gradient field of the selected direction is switched on. Here, only the magnitude of the gradient is shown (compare "G mag"), which is identical for all projections of the different directions. Then an extended amplitude- and frequency-modulated pulse is applied with gaps (compare "RF amp" for the amplitude and "RF freq" for the frequency as a function of time). Along with the pulse, data acquisition starts (compare "AQ"), and data is acquired during the gaps of the pulse. The acquisition is continued after the pulse. Only the real part of the acquired data is shown. The imaginary part is a data vector of the same length. The shown acquisition block is repeated with inverted gradient direction, resulting in two additional data vectors. The obtained four real-valued data vectors are used to reconstruct the respective projection. In order to enable the reconstruction of a 3D image, the couple of acquisitions are repeated several times with different gradient directions in 3D space.

Figure 4A:
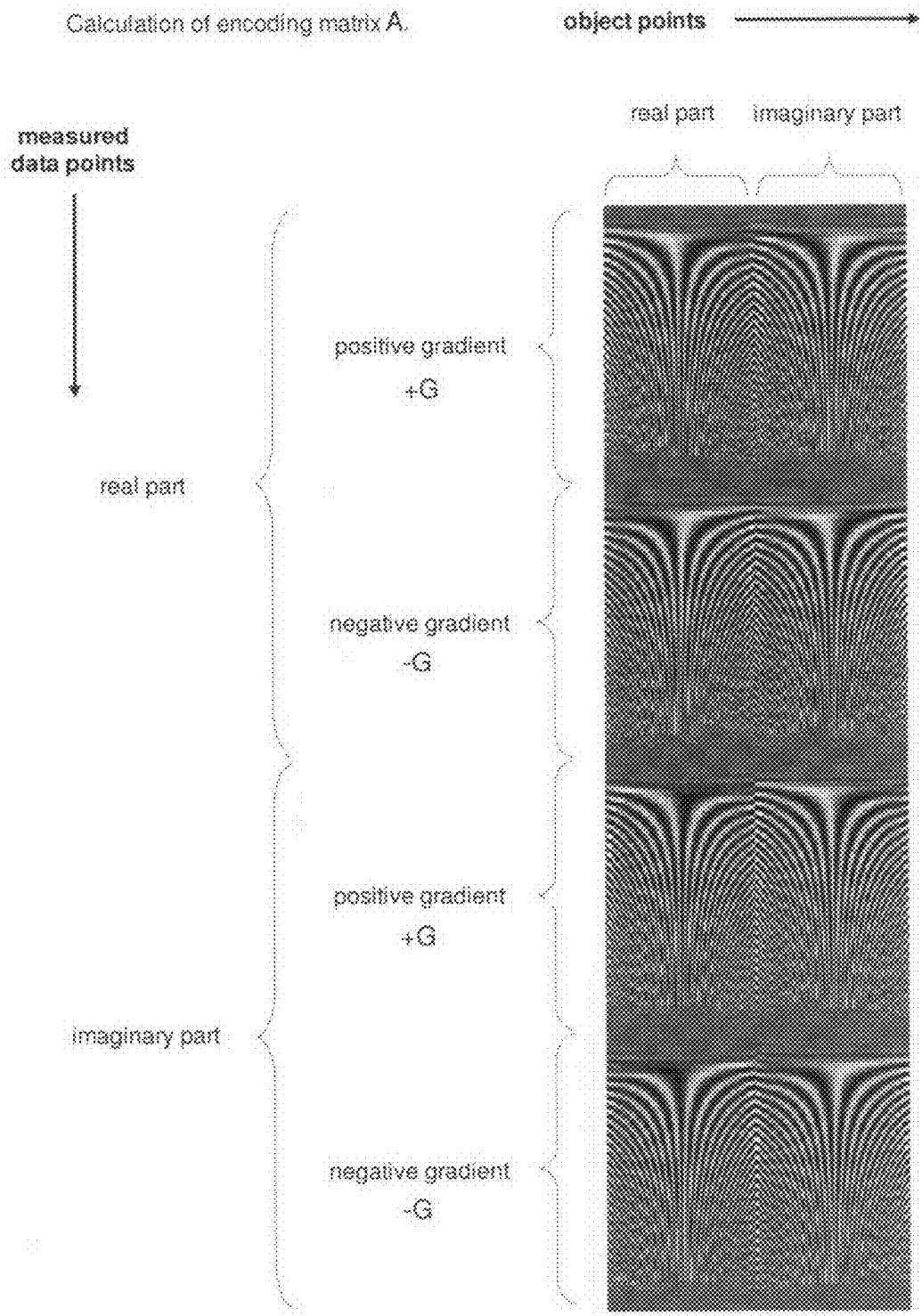
FIGS. 4(*a*) to 4(*f*) illustrate all steps (a) through (f) of the reconstruction for the selected example, in accordance with the invention.

FIG. 4(a) to (f) illustrate the steps of the image reconstruction. In FIG. 4(a) the encoding matrix A derived from the encoding procedure is shown using a grey scale representation of the real-valued matrix entries. Rows correspond to points in the object domain, and columns correspond to points in the domain of the measured data.

Figure 4D:
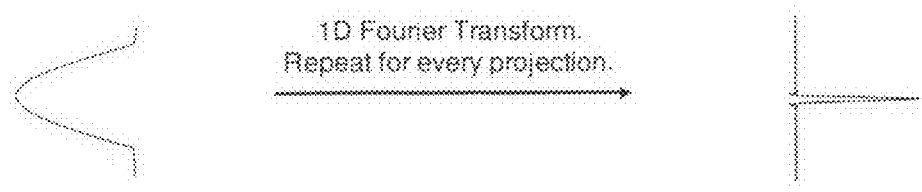
Figure 4E:
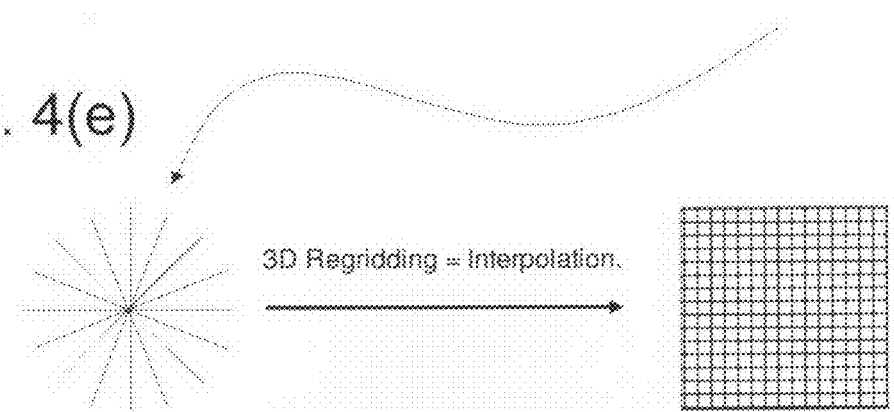
Figure 4F:
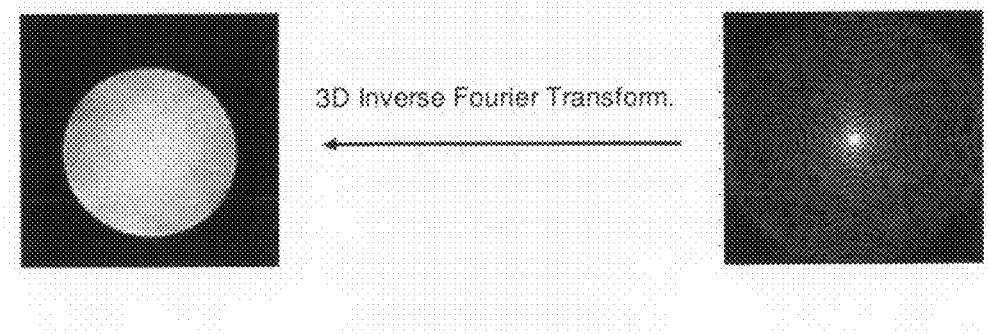

In the object domain, real and imaginary parts of the object vector are separated. In the data domain, the four vectors for the combinations of gradient polarity (+G, −G) and real and imaginary part are also separated as indicated. FIG. 4(b) illustrates the next reconstruction step, the inversion of the encoding matrix A by e.g. using an SVD algorithm, resulting in the reconstruction matrix $A^+$. FIG. 4(c) illustrates the reconstruction of one projection, represented by the magnitude projection, from the four real-valued data vectors, represented by the real part with positive gradient polarity. This calculation is repeated for each gradient direction in 3D space. FIG. 4(d) illustrates the 1D Fourier transformation of a projection that is repeated for each projection. FIG. 4(e) illustrates the 3D gridding procedure, where the appropriately sorted Fourier transformed projection data is interpolated onto a Cartesian grid. Here and in the following, only a 2D representation of the 3D data is shown. FIG. 4(f) illustrates the final step of the image reconstruction, the 3D Fourier transform of the data on the Cartesian grid, resulting in the image of the object under investigation. Note that the Fourier transform is used here for combining the series of consistent, artefact-free 1D projections that have been obtained with the inversion method. It would not have been possible to obtain the presented results directly by means of Fourier transform. In the shown example, the object was a glass sphere filled with water.

The following parameters were used in the example: A field-of-view of 7 cm was selected with an image matrix of 96 in all three spatial dimensions. Data acquisition was performed with 60 complex nominal data points per acquisition of duration 1.2 ms, resulting in a nominal bandwidth of 50 kHz. With 16-fold acquisition oversampling, 960 complex, or 1920 real-valued data points were obtained. During the first 0.24 ms of the acquisition, a hyperbolic secant pulse was applied. During the dwell time of 20 µs, the pulse was played out for the first 2.5 µs, and data taken from the last 12.5 µs was used for image reconstruction. Hence, four real-valued vectors with 600 data points, or totally 2400 values were used to reconstruct a projection of 96 complex, or 192 real values. The 3D image was reconstructed from 14565 different projections that were obtained from 29130 acquisitions.

REFERENCES

U.S. Pat. No. 7,403,006 B2;
U.S. Pat. No. 7,425,828 B2;
Hafner S, Fast imaging in liquids and solids with the back-projection low angle shot (BLAST) technique, Magn Reson Imag 12 (1994) 1047-1051;
Pipe J G, Spatial encoding and reconstruction in MRI with quadratic phase profiles, Magn Reson Med 33 (1995) 24-33;
Idiyatullin D, Corum C, Park J Y, Garwood M, Fast and quiet MRI using a swept radiofrequency, J Magn Reson 181 (2006) 342-349;
Dadok J, Sprecher R, Correlation NMR spectroscopy, J Magn Reson 13 (1974) 243-248;
Kuethe D O, Caprihan A, Lowe I J, Madio D P, Gach H M Transforming NMR Data Despite Missing Points, J Magn Reson 139 (1999) 18-25;
Park J Y, DelaBarre L, Garwood M, Improved gradient-echo 3D magnetic resonance imaging using pseudo-echoes created by frequency-swept pulses, Magn Reson Med 55 (2006) 848-857;
Pruessmann K P, Weiger M, Börnert P, Boesiger P, Advances in sensitivity encoding with arbitrary k-space trajectories, Magn Reson Med 46 (2001) 638-651.

We claim:

1. A method for magnetic resonance spectroscopy (=MRS) or magnetic resonance imaging (=MRI), the method comprising the steps of:

a) applying, using an RF excitation coil, an RF excitation pulse to an object undergoing magnetic resonance spectroscopy or magnetic resonance imaging and located within an applied magnetic field that depends on spatial position and/or time, in order to create a time-domain signal, with the time-domain signal being generated by an excited transverse nuclear magnetisation precessing about the applied magnetic field, wherein the RF excitation pulse is structured to cover a whole range of NMR frequencies of interest which are present in the object;

b) recording, using the RF excitation coil or an RF receiving coil, the time-domain signal either during or during and after application of the RF excitation pulse in step a);

c) calculating an encoding matrix $A_{n\alpha}$, wherein:

$$A_{n\alpha} = \sum_{m=0}^{n-1} P_m e^{i\Phi(n,m,\alpha)}$$

n being a running number of a time-domain signal point, $\alpha$ a running number of a discrete image or spectral element, $P_m$ an m-th discrete element of the RF excitation pulse in a time-domain, and $\Phi(n, m, \alpha)$ a phase accrued by the transverse nuclear magnetisation related to the discrete image or spectral element $\alpha$ in a time between the discrete RF excitation pulse element $P_m$ and the time-domain signal point n under an influence of the applied magnetic field;

d) inverting the encoding matrix to generate a reconstruction matrix;

e) extracting a vector of time domain signal points from the time domain signal; and f) calculating a matrix product between the reconstruction matrix and the vector of time domain signal points in order to reconstruct spectral or image data and to generate a spectrum or an image therefrom.

2. The method of claim 1, wherein the applied magnetic field is static and homogeneous and, in step f), a spectrum is reconstructed that shows a distribution of NMR frequencies inherent to the object.

3. The method of claim 1, wherein the applied magnetic field comprises a static homogeneous component and a time-dependent gradient component, wherein, in step f), images of the object or a part thereof are reconstructed.

4. The method of claim 1, wherein the magnetic field comprises a static homogeneous component and a gradient component that is static during the RF pulse and during the acquisition step, wherein images of the object are reconstructed in step f).

5. The method of claim 1, wherein an amplitude of the RF excitation pulse is zero for certain time intervals, and wherein acquisition of time domain signal points occurs during the zero amplitude time intervals.

6. The method of claim 1, wherein a frequency of the RF excitation pulse depends on a manner in which the excitation pulse is being applied to the object over time in either a continuous, non-continuous, or random manner.

7. The method of claim 1, wherein the RF transmission coil comprises decoupled transmit and receive circuits structured for simultaneous RF transmission and reception.

8. The method of claim 1, wherein, in step b), acquisition oversampling is performed, a time-domain signal sampling rate being higher than required by a frequency range covered by the object or spectrum to be reconstructed, wherein the oversampling is sufficiently high to account for effects of transmit-receive switching, in order to provide an implicit extrapolation of missing time-domain signal points, and in order to provide an accurate representation of effects created by the used RF pulse, thereby enabling creation and inversion of the encoding matrix.

9. The method of claim 1, wherein a known or estimated value of a transverse relaxation constant T2* for the object is taken into account as an exponential filtering in the encoding matrix in order to improve a resolution or a signal-to-noise ratio of the reconstructed image or spectrum.

10. The method of claim 1, wherein additional filtering is directly taken into account by the reconstruction of step f).

11. The method of claim 1, wherein complex or real image or spectrum data are reconstructed, wherein creating a real-valued result is achieved by appropriate zero order phase correction applied directly to the raw data or incorporated into the encoding matrix.

12. The method of claim 1, wherein step f) further comprises taking into account sensitivities of one or more receiver coils in the reconstruction in order to perform one or more of the following tasks: a correction for a spatially changing intensity of the receiver coil, correction for a spatially changing phase of the receiver coil, and using a spatially changing intensity and phase of the receiver coil as an additional source of spatial encoding.

13. The method of claim 1, wherein the encoding matrix inversion of step d) is performed using iterative procedures.

14. The method of claim 1, wherein several measurements take place with a same static and homogeneous component of the applied magnetic field and different additional components of the applied magnetic field, each measurement experiment leading to a partial reconstruction of a sub-space of the object, with the full reconstruction being made by combination of these partial reconstructions.

15. The method of claim 14, wherein the partial reconstructions represent one-dimensional projections of the object in different directions, and the full reconstruction is made by either back-projection or by a one-dimensional Fourier transform of the projections followed by an interpolation onto a three-dimensional grid and a subsequently executed three-dimensional inverse Fourier transform.

* * * * *